US008645892B1

(12) United States Patent
Gupta et al.

(10) Patent No.: US 8,645,892 B1
(45) Date of Patent: Feb. 4, 2014

(54) CONFIGURABLE CIRCUIT AND MESH STRUCTURE FOR INTEGRATED CIRCUIT

(71) Applicants: Vishal Gupta, Noida (IN); Puneet Dodeja, Delhi (IN); Hans Raj Singh, Ghaziabad (IN)

(72) Inventors: Vishal Gupta, Noida (IN); Puneet Dodeja, Delhi (IN); Hans Raj Singh, Ghaziabad (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/735,053

(22) Filed: Jan. 7, 2013

(51) Int. Cl.
| G06F 17/50 | (2006.01) |
| H03K 19/177 | (2006.01) |
| H03K 19/173 | (2006.01) |
| H01L 25/00 | (2006.01) |
| G06F 7/38 | (2006.01) |

(52) U.S. Cl.
CPC ........ G06F 17/5077 (2013.01); G06F 17/5072 (2013.01); G06F 17/5054 (2013.01); G06F 7/38 (2013.01); H03K 19/177 (2013.01); H03K 19/173 (2013.01); H01L 25/00 (2013.01)
USPC ........... 716/130; 716/129; 716/128; 716/122; 716/123; 716/121; 326/38; 326/41; 326/101; 327/603

(58) Field of Classification Search
CPC ............ G06F 17/5077; G06F 17/5072; G06F 17/5054; G06F 7/38; H03K 19/177; H03K 19/173; H01L 25/08
USPC ................. 716/130, 129, 128, 122, 123, 121; 326/38, 41, 101; 327/603
See application file for complete search history.

(56) References Cited

U.S. PATENT DOCUMENTS

| 5,317,698 A | * | 5/1994 | Chan ............................. 710/316 |
| 5,469,003 A | * | 11/1995 | Kean ............................... 326/39 |
| 5,500,609 A | * | 3/1996 | Kean ............................... 326/41 |
| 5,502,404 A | | 3/1996 | Landers |
| 5,509,128 A | * | 4/1996 | Chan ............................. 710/316 |
| 5,528,176 A | * | 6/1996 | Kean ............................. 326/105 |
| 5,552,722 A | * | 9/1996 | Kean ............................... 326/41 |
| 5,670,897 A | * | 9/1997 | Kean ............................... 326/41 |
| 5,798,656 A | * | 8/1998 | Kean ............................... 326/39 |
| 5,831,448 A | * | 11/1998 | Kean ............................... 326/41 |
| 5,861,761 A | * | 1/1999 | Kean ............................... 326/41 |
| 6,014,509 A | * | 1/2000 | Furtek et al. ..................... 326/41 |
| 6,026,227 A | * | 2/2000 | Furtek et al. ..................... 326/40 |
| 6,181,163 B1 | * | 1/2001 | Agrawal et al. ................. 326/41 |
| 6,226,779 B1 | * | 5/2001 | Baxter et al. .................... 326/16 |

(Continued)

OTHER PUBLICATIONS

Guo et al., "Array Processors with Pipelined Optical Busses", IEEE, 1990, pp. 333-342.*

(Continued)

*Primary Examiner* — Phallaka Kik
(74) *Attorney, Agent, or Firm* — Charles Bergere

(57) ABSTRACT

An integrated circuit (IC) design includes configurable circuits arranged in a mesh structure to facilitate routing of signals between different platforms or logic blocks within the design. Each configurable circuit has a semiconductor element with input and output terminals in a first semiconductor layer, input/output (I/O) ports corresponding to directions of the mesh structure in a second semiconductor layer, configurable input vias to allow a signal traveling in a first direction to be received, and configurable output vias that allow an output signal to be output from the configurable circuit in a second direction.

17 Claims, 4 Drawing Sheets

(56) References Cited

U.S. PATENT DOCUMENTS

| | | | |
|---|---|---|---|
| 6,275,065 B1 * | 8/2001 | Mendel | 326/39 |
| 6,292,018 B1 * | 9/2001 | Kean | 326/41 |
| 6,353,921 B1 * | 3/2002 | Law et al. | 257/210 |
| 6,567,969 B1 * | 5/2003 | Agrawal et al. | 326/38 |
| 7,135,888 B1 * | 11/2006 | Hutton et al. | 326/41 |
| 7,137,094 B2 | 11/2006 | Tien | |
| 7,312,633 B1 * | 12/2007 | Hutton et al. | 326/41 |
| 7,965,107 B2 | 6/2011 | Ciccarelli | |
| 7,986,166 B1 | 7/2011 | Verma | |

OTHER PUBLICATIONS

Tsuda, "ABL-Tree: A Constant Diameter Interconnecftion Network for Reconfigurable Processor Arrays Capable of Distributed Communication", Proceedings of the 2001 IEEE International Symposium on Defect and Fault Tolerance in VLSI Systems, 2001, 6 pages.*

Venkateswaran et al., "A Hexagonal Array Machine for Multilayer Wire Routing", IEEE Transactions on Computer-Aided Design, vol. 9, No. 10, Oct. 1990, pp. 1096-1112.*

\* cited by examiner

CONFIGURABLE CIRCUIT AND MESH STRUCTURE FOR INTEGRATED CIRCUIT

BACKGROUND OF THE INVENTION

The present invention relates generally to integrated circuits, and more particularly, to an integrated circuit layout with a mesh structure and configurable buffer circuits.

An integrated circuit (IC) includes a plurality of metal layers used to route signals, as well as power and ground, between circuit elements. The metal layers are interconnected with vias. Prior to fabrication, the IC is designed and laid out. The layout designing process has two phases, a pre-mask phase and a post-mask phase. The pre-mask phase includes IC layout designing before generation of a photo mask corresponding to the IC layout. The post-mask phase includes IC layout designing after generation of the photo mask. One photo mask may include 60-80 individual masks. Transistor masks have the smallest feature size and are therefore the most expensive, whereas metal layer masks have large feature sizes and are therefore less expensive.

Engineering change orders (ECOs) are last-minute design changes implemented during both the pre-mask and post-mask phases to rectify design errors found during testing. The ECOs are often implemented using spare cells present in the IC layout by connecting some of the spare cells with the operational cells, which of course requires routing signals between the spare cells and the operational cells. The operational cells and spare cells may be present in a single semiconductor platform, or they may be present in different platforms. As used herein, the term platform means a logic block or pre-defined circuit that has defined boundaries, such as a processor core or a memory (e.g., DDR memory).

When the operational cells and the spare cells used for an ECO are within the same platform, it is relatively easy to route the connections. However, when the operational cells and spare cells used to implement an ECO are located in different platforms, more routing resources are required to route the signal(s) between platforms.

It would be advantageous to have an IC layout that facilitates routing of signals from between platforms through fewer metal layers.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
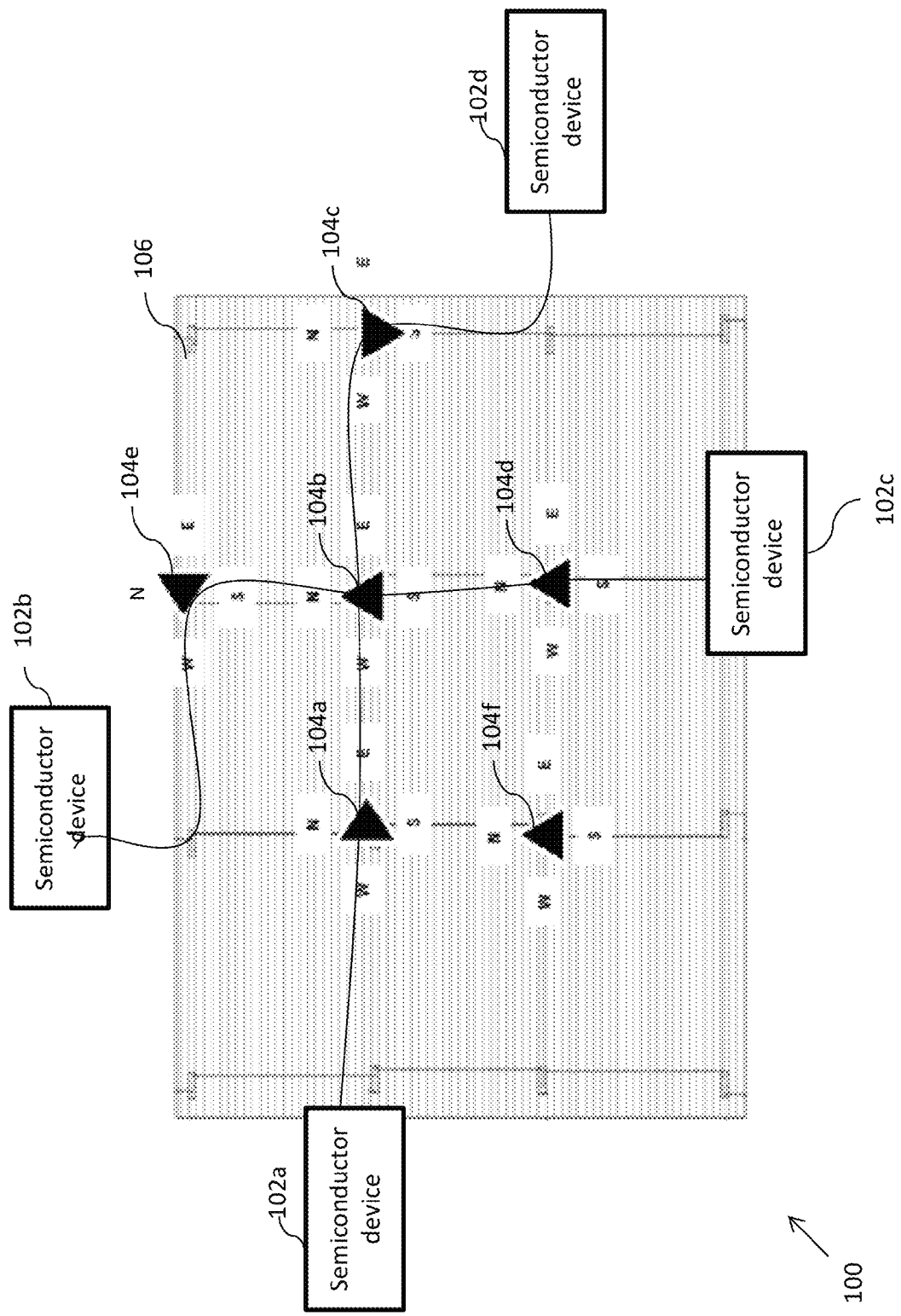
FIG. 1 is a schematic diagram of an IC layout in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an Integrated circuit (IC) layout is provided. The IC layout includes a plurality of semiconductor devices, including a source semiconductor device and a destination semiconductor device. A plurality of configurable circuits is connected between the source and destination semiconductor devices in a mesh structure for routing a signal from the source semiconductor device to the destination semiconductor device. Each configurable circuit includes a first semiconductor layer, a second semiconductor layer formed over the first semiconductor layer, and a semiconductor element formed in the first semiconductor layer. The semiconductor element includes an input terminal for receiving the signal and an output terminal for outputting an output signal. A plurality of bidirectional input/output (I/O) ports—including first, second, third, and fourth bidirectional I/O ports—is formed in the second semiconductor layer, wherein the first, second, third, and fourth bidirectional I/O ports represent first, second, third, and fourth directions of the mesh structure, respectively. The configurable circuit further includes at least one input conducting ring, which includes first and second input conducting paths that are substantially parallel and formed in the first semiconductor layer. The at least one input conducting ring further includes third and fourth input conducting paths that are substantially parallel and formed in the second semiconductor layer, wherein the third and fourth input conducting paths are orthogonal to the first and second input conducting paths. First, second, third, and fourth fixed vias extend from the first semiconductor layer to the second semiconductor layer and connect the first, second, third, and fourth input conducting paths. The configurable circuit further includes at least one output conducting ring which includes first and second output conducting paths that are substantially parallel and formed in the first semiconductor layer. The at least one output conducting ring includes third and fourth output conducting paths that are substantially parallel and formed in the second semiconductor layer, wherein the third and fourth output conducting paths are orthogonal to the first and second output conducting paths. First, second, third and fourth fixed vias extend from the first semiconductor layer to the second semiconductor layer and connect the first, second, third, and fourth output conducting paths. First and second configurable input vias extend from the first semiconductor layer to the second semiconductor layer and selectively connect the first and second bidirectional I/O ports and the first input conducting path, respectively. Third and fourth configurable input vias extend from the first semiconductor layer to the second semiconductor layer and selectively connect the third and fourth bidirectional I/O ports and the second input conducting path, respectively. First and second configurable output vias extend from the first semiconductor layer to the second semiconductor layer and selectively connect the first and second bidirectional I/O ports and the first output conducting path, respectively. Third and fourth configurable output vias extend from the first semiconductor layer to the second semiconductor layer and selectively connect the third and fourth bidirectional I/O ports and the second output conducting path, respectively. The first, second, third, and fourth configurable input vias are configured such that the signal is received from the source semiconductor device at the input terminal from one of the first, second, third, and fourth directions by way of one of the first, second, third, and fourth bidirectional I/O ports, and the first, second, third, and fourth configurable output vias are configured in such a way that the output signal is routed to the destination semiconductor device from the output terminal in one of the first, second, third, and fourth directions by way of one of the first, second, third, and fourth bidirectional I/O ports.

In another embodiment of the present invention, a mesh structure of a plurality of configurable circuits is provided. The plurality of configurable circuits is connected between a source and a destination semiconductor device of a plurality of semiconductor devices of an IC layout. At least one configurable circuit of the mesh structure is configured to route a signal from the source semiconductor device to the destination semiconductor device. Each configurable circuit includes a first semiconductor layer, a second semiconductor layer formed over the first semiconductor layer, and a semiconductor element formed in the first semiconductor layer. The semiconductor element includes an input terminal for receiving the signal and an output terminal for outputting an output signal. A plurality of bidirectional input/output (I/O) ports including first, second, third, and fourth bidirectional I/O ports are formed in the second semiconductor layer, wherein the first, second, third, and fourth bidirectional I/O ports represent first, second, third, and fourth directions of the mesh structure, respectively. At least one input conducting ring includes first and second input conducting paths that are substantially parallel and formed in the first semiconductor layer. The at least one input conducting ring further includes third and fourth input conducting paths that are substantially parallel and formed in the second semiconductor layer, wherein the third and fourth input conducting paths are orthogonal to the first and second input conducting paths. First, second, third, and fourth fixed vias extend from the first semiconductor layer to the second semiconductor layer and connect the first, second, third, and fourth input conducting paths. At least one output conducting ring includes first and second output conducting paths that are substantially parallel and formed in the first semiconductor layer. Third and fourth output conducting paths are substantially parallel and are formed in the second semiconductor layer. The third and fourth output conducting paths are orthogonal to the first and second output conducting paths. First, second, third and fourth fixed vias extend from the first semiconductor layer to the second semiconductor layer and connect the first, second, third, and fourth output conducting paths. First and second configurable input vias extend from the first semiconductor layer to the second semiconductor layer and selectively connect the first and second bidirectional I/O ports and the first input conducting path, respectively. Third and fourth configurable input vias extend from the first semiconductor layer to the second semiconductor layer and selectively connect the third and fourth bidirectional I/O ports and the second input conducting path, respectively. First and second configurable output vias extend from the first semiconductor layer to the second semiconductor layer and selectively connect the first and second bidirectional I/O ports and the first output conducting path, respectively. Third and fourth configurable output vias extend from the first semiconductor layer to the second semiconductor layer and selectively connect the third and fourth bidirectional I/O ports and the second output conducting path, respectively. The first, second, third, and fourth configurable input vias are configured such that the signal is received from the source semiconductor device at the input terminal from one of the first, second, third, and fourth directions by way of one of the first, second, third, and fourth bidirectional I/O ports, and the first, second, third, and fourth configurable output vias are configured in such a way that the output signal is routed to the destination semiconductor device from the output terminal in one of the first, second, third, and fourth directions by way of one of the first, second, third, and fourth bidirectional I/O ports.

Various embodiments of the present invention provide an integrated circuit layout that includes a plurality of semiconductor devices and a plurality of configurable circuits connected in a mesh structure. A signal originating from a source semiconductor device is routed to a destination semiconductor device by way of the plurality of the configurable circuits. Each configurable circuit includes a semiconductor element, four bidirectional I/O ports corresponding to North, South, East, and West directions of the mesh structure, a plurality of fixed vias, a plurality of configurable vias, and a plurality of conducting paths formed in two metal layers. The configurable vias are configured such that the signal is received at the semiconductor element from the source semiconductor device from one of the North, South, East, and West directions by way of one of the first, second, third, and fourth bidirectional I/O ports, and an output signal is routed to the destination semiconductor device from the semiconductor element in one of the North, South, East and West directions by way of one of the first, second, third, and fourth bidirectional I/O ports. Each configurable circuit utilizes at the most two metal layers for routing the signal from the source semiconductor device to the destination semiconductor device, thus resulting in a significant saving in metal layer usage and turnaround times as compared to the metal layer usage and turnaround times of the existing IC layouts. The mesh structure of the configurable circuits is useful for receiving a signal from any direction/location and systematically routing it to any location/direction in the IC with minimum effort and changes in routing paths. The IC layout of the present invention is efficient and supports ECO implementation with minimum design overhead during pre-mask and post-mask phases.

Referring now to FIG. 1, a schematic diagram illustrating a layout 100 of an integrated circuit in accordance with an embodiment of the present invention is shown. The layout 100 may include layout of a microprocessor, a microcontroller unit (MCU), a system-on-chip (SoC), or an application specific integrated circuit (ASIC). In the drawing, the layout 100 includes first through fourth semiconductor devices 102a-102d (collectively referred to as semiconductor devices 102), and first through sixth configurable circuits 104a-104f (collectively referred to as configurable circuits 104) connected in a mesh structure 106. The mesh structure 106 means that each configurable circuit 104 is configured to receive a signal from and send a signal to an adjacent configurable circuit 104. Although four semiconductor devices 102a-102d and six configurable circuits 104a-104f are shown, it will be apparent to those skilled in the art that the IC layout 100 may include many semiconductor devices 102 and configurable circuits 104.

The semiconductor devices 102 may include standard cells, each configured to provide a Boolean logic function. The semiconductor devices 102 communicate with each other via the configurable circuits 104. For example, a signal originating from the semiconductor device 102a (hereinafter referred to as first source device) is routed to the semiconductor device 102d (hereinafter referred to as first destination device) by way of the configurable circuits 104a, 104b and 104c. Similarly, a signal originating from the semiconductor device 102c (hereinafter referred to as second source device) is routed to the semiconductor device 102b (hereinafter referred to as second destination device) by way of the configurable circuits 104d, 104b and 104e.

The configurable circuits 104 may include logic circuits formed adjacent to each other but configured to route signals in different directions, as explained in more detail below. In the drawings, the points on a compass, North, South, East and West, are used to designate directions. In one embodiment of the invention, the configurable circuits can act as both repeaters and as connections. Thus, for example, if a signal is transmitted from the semiconductor device 102a to the semiconductor device 102d, the signal goes from the device 102a to the configurable circuit 104a, then to configurable circuit 104b, then configurable circuit 104c, and from configurable 104c to the semiconductor device 102d. For this example, the configurable circuit 104a is configured to act as a repeater when transmitting a signal from West to East, as indicated by the arrow, but the circuit 104b is configured act as a repeater when transmitting a signal from South to North, as shown by the arrow. However, since the circuit 104b also passes the signal from circuit 104a to circuit 104c, in this case the circuit 104b acts as a plain connection. Circuit 104c is configured as a repeater to transmit the signal from circuit 104b to the semiconductor device 102d.

As previously mentioned, each configurable circuit 104 is configured to receive a signal from and send a signal to an adjacent configurable circuit 104. So repeating the above example, the configurable circuit 104a receives a signal from the first source device 102a and routes the signal to the configurable circuit 104b situated to the East of the configurable circuit 104a. The configurable circuit 104b receives the signal from the configurable circuit 104a and routes the signal to the configurable circuit 104c situated to the East of the configurable circuit 104b. The configurable circuit 104c receives the signal from the configurable circuit 104b and routes the signal to the first destination device 102d situated to the South of the configurable circuit 104c.

In an exemplary embodiment of the present invention, the IC layout 100 includes multiple semiconductor platforms, and the first and second source devices 102a and 102c are formed in a first semiconductor platform and the first and second destination devices 102d and 102b are formed in a second semiconductor platform. The first and second destination devices 102d and 102b are spare cells, and along with the mesh structure 106 are used for implementing ECOs in the IC layout 100 during pre-mask and post-mask phases of the IC layout design.

Figure 2:
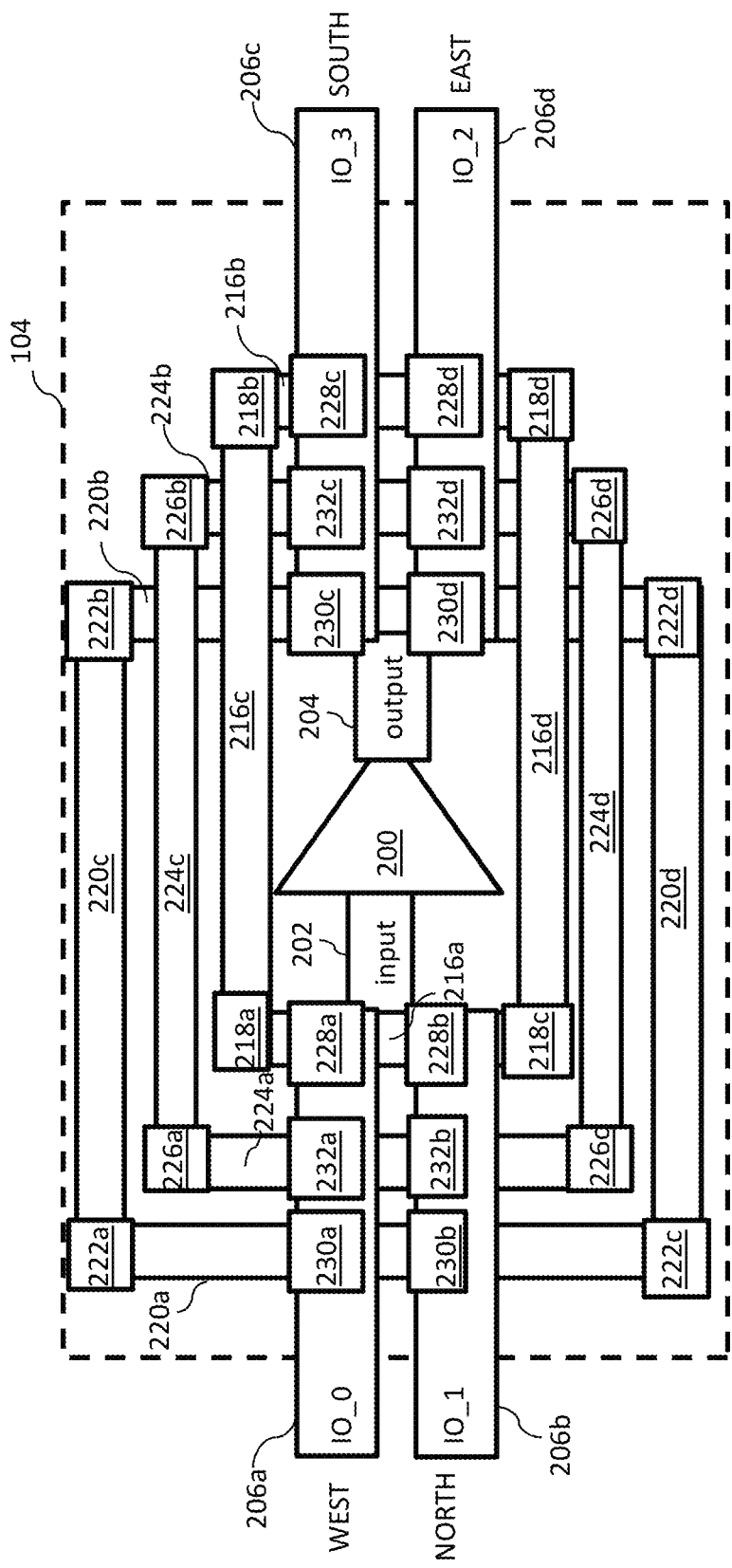
FIG. 2 is a schematic diagram of a configurable circuit in accordance with an embodiment of the present invention.

Referring now to FIG. 2, a schematic diagram of a configurable circuit 104 in accordance with an embodiment of the present invention is shown. The configurable circuit 104 includes a semiconductor element 200 and first through fourth bidirectional I/O ports 206a-206d (collectively referred to as bidirectional I/O ports 206) formed in a first semiconductor layer. As used herein, the term semiconductor layer refers to the multiple layers from which a semiconductor device is formed, which are well known to those of skill in the art. For example, an IC may include multiple metal layers separated by insulation layers, with the metal layers being interconnected with vias. In an embodiment of the present invention, the first, second, third, and fourth bidirectional I/O ports 206a-206d are formed around the semiconductor element 200 and represent West, North, South, and East directions of the mesh structure 106, and are hereinafter referred to as West, North, South, and East I/O ports respectively. The West port 206a is configured to receive from and send a signal to an adjacent device (102, 104) situated to the West thereof, the East port 206d to receive from and send a signal to an adjacent device (102, 104) situated to the East thereof, the South port 206c to receive from and send a signal to an adjacent device (102, 104) situated to the South thereof, and the North port to receive from and send a signal to an adjacent device (102, 104) situated to the North thereof.

The semiconductor element 200 has an input terminal 202 for receiving an input signal and an output terminal 204 for generating an output signal. In various embodiments of the present invention, the semiconductor element 200 is one of an inverter, a buffer, a multiplexer, and a repeater. When the semiconductor element 200 is an inverter, a buffer or a multiplexer, the input terminal 202 receives the input signal from one of the West, North, South, and East ports 206, and the output terminal 204 sends the output signal to another one of the West, North, South, and East I/O ports 206. When the semiconductor element 200 is a multiple-input single-output multiplexer, it can receive the input signals from all four directions and can output the output signal in any of the four directions. For example, a two-input mux receives inputs from any two directions and provides the output signal in the other two directions.

The configurable circuit 104 further includes an input conducting ring formed of first through fourth input conducting paths 216a-216d (collectively referred to as input conducting paths 216). The first input conducting path 216a extends from the input terminal 202 for configuring the first input conducting ring to conduct signals input at the input terminal 202.

The first and second input conducting paths 216a and 216b are substantially parallel to each other and are formed in the first semiconductor layer. The third and fourth input conducting paths 216c and 216d are substantially parallel to each other and are formed in a second semiconductor layer. The third and fourth input conducting paths 216c and 216d are substantially orthogonal to the first and second input conducting paths 216a and 216b. The input conducting paths 216 are interconnected by way of first through fourth fixed input vias 218a-218d (collectively referred to as fixed input vias 218), extending from the first to the second semiconductor layer. The first and second semiconductor layers represent first and second spaced parallel planes of the IC layout 100 respectively.

The configurable circuit 104 further includes an output conducting ring formed of first through fourth output conducting paths 220a-220d (collectively referred to as output conducting paths 220). The second output conducting path 220b extends from the output terminal 204 for configuring the first output conducting ring to conduct signals output from the output terminal 204.

The first and second output conducting paths 220a and 220b are substantially parallel to each other and are formed in the first semiconductor layer. The third and fourth output conducting paths 220c and 220d are substantially parallel to each other and are formed in the second semiconductor layer. The third and fourth output conducting paths 220c and 220d are substantially orthogonal to the first and second output conducting paths 220a and 220b. The output conducting paths 220 are interconnected by way of first through fourth fixed output vias 222a-222d (collectively referred to as fixed output vias 222), extending from the first to the second semiconductor layer.

The configurable circuit 104 further includes a bypass conducting ring formed of first through fourth bypass conducting paths 224a-224d (collectively referred to as bypass conducting paths 224). The first and second bypass conducting paths 224a and 224b are substantially parallel to each other and are formed in the first semiconductor layer, and the third and fourth bypass conducting paths 224c and 224d are substantially parallel to each other and are formed in the second semiconductor layer. The third and fourth bypass conducting paths 224c and 224d are substantially orthogonal to the first and second bypass conducting paths 224a and 224b. The bypass conducting paths 226a-226d are interconnected by way of first through fourth fixed bypass vias 226a-226d (collectively referred to as fixed bypass vias 226) extending from the first to the second semiconductor layer.

The first and second input conducting paths 216a and 216b, the first and second output conducting paths 220a and 220b, and the first and second bypass conducting paths 224a and 224b are formed in a first metal layer of the IC layout 100. The third and fourth input conducting paths 216c and 216d, the third and fourth output conducting paths 220c and 220d, and the third and fourth bypass conducting paths 224c and 224d are formed in a second metal layer in the IC layout 100. Thus, the configurable circuit 104 may be formed using only two metal layers for routing signals among the bidirectional I/O ports 206.

The configurable circuit 104 further includes first through fourth configurable input vias 228a-228d (collectively referred to as configurable input vias 228) extending from the first to the second semiconductor layer. The first and second configurable input vias 228a and 228b selectively connect the West and North ports 206a and 206b with the first input conducting path 216a. Similarly, the third and fourth configurable input vias 228c and 228d selectively connect the South and East ports 206c and 206d with the second input conducting path 216b. In other words, the West, North, South, and East ports 206 can be selectively connected to the input conducting ring via the configurable input vias 228a-228d, respectively.

The configurable circuit 104 further includes first through fourth configurable output vias 230a-230d (collectively referred to as configurable output vias 230) extending from the first to the second semiconductor layer. The first and second configurable output vias 230a and 230b selectively connect the West and North ports 206a and 206b with the first output conducting path 220a, respectively. Similarly, the third and fourth configurable output vias 230c and 230d selectively connect the South and East ports 206c and 206d with the second output conducting path 220b, respectively. In other words, the output conducting ring can be selectively connected to the West, North, South, and East ports 206a-206d with the configurable output vias 230a-230d, respectively.

In an embodiment of the present invention, the configurable circuit 104 further includes first through fourth configurable bypass vias 232a-232d (collectively referred to as configurable bypass vias 232) extending from the first to the second semiconductor layer. The first and second configurable bypass vias 232a and 232b selectively connect the West and North ports 206a and 206b with the first bypass conducting path 224a, respectively. Similarly, the third and fourth configurable bypass vias 232c and 232d selectively connect the South and East ports 206c and 206d with the second bypass conducting path 224b, respectively. In other words, the West, North, South, and East ports 206 can be selectively connected to the bypass conducting ring using the configurable bypass vias 232a-232d, respectively.

The configurable input vias 228, the configurable output vias 230, and the configurable bypass vias 232 are arranged such that an input signal traveling in a first direction is received at the input terminal 202 and the output signal is routed in any of the four directions (N, S, E or W) from the output port 204. The procedure for determining the direction of the output signal will be explained in detail in conjunction with FIGS. 3 and 4.

Figure 3:
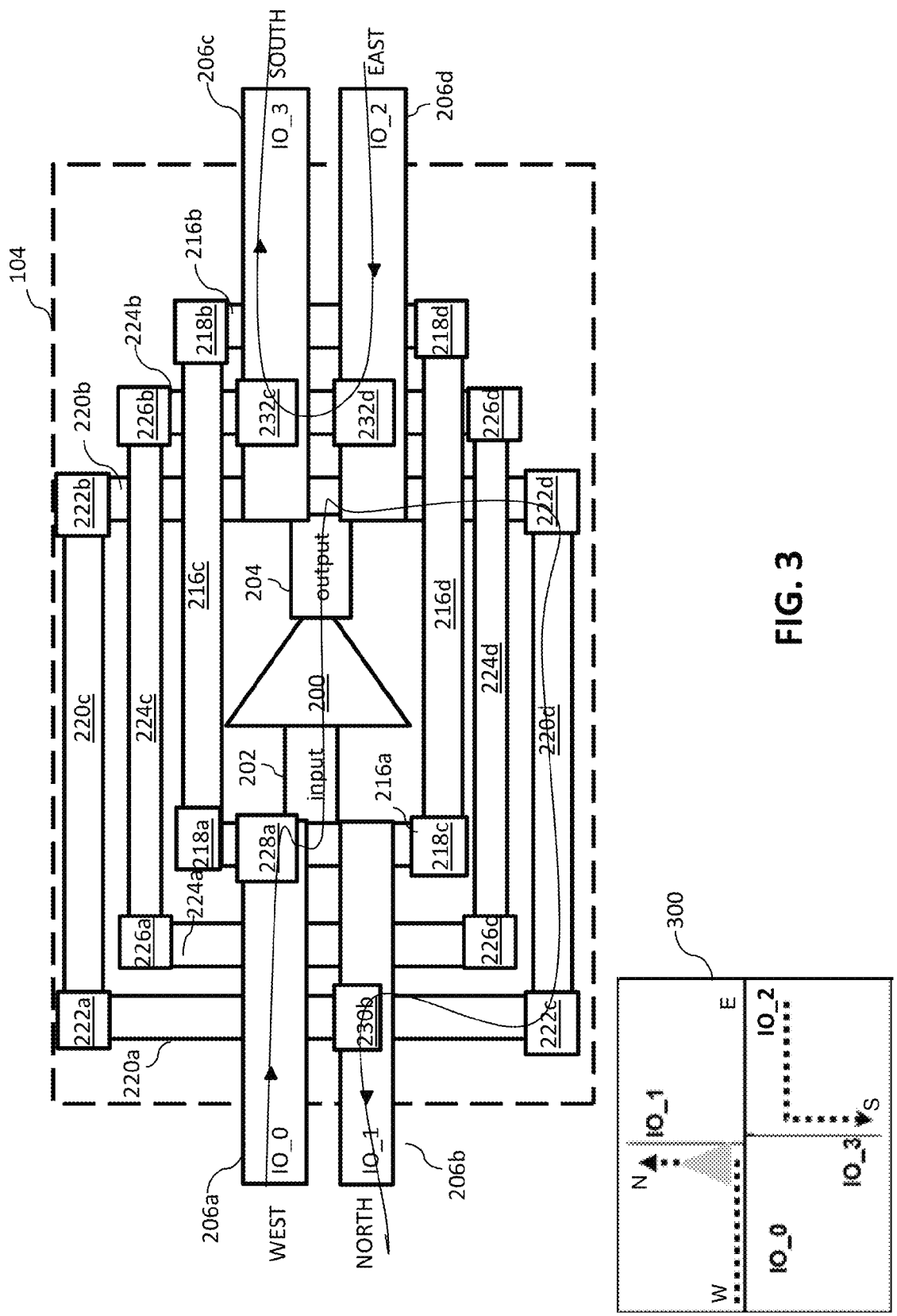
FIG. 3 is a schematic diagram of a configurable circuit configured for routing a first signal from West to North, and a second signal from East to South, in accordance with an embodiment of the present invention.

Referring now to FIG. 3, a schematic diagram of a configurable circuit 104 configured for routing a first signal from the West port 206a to the North port 206b and a second signal from the East port 206d to the South port 206c in accordance with an embodiment of the present invention is shown.

The configurable circuit 104 receives a first input signal from either an adjacent semiconductor device 102 or an adjacent configurable circuit 104 located to the West thereof and routes a first output signal to another adjacent semiconductor device 102 or another adjacent configurable circuit 104 located to the North thereof, by way of the semiconductor element 200. The West port 206a of the configurable circuit 104 is configured to receive the first input signal by connecting the West port 206a to the input conducting ring 216 by way of the configurable input via 228a. The semiconductor element 200 then receives the first input signal and generates the first output signal. The North port 206b is connected to the output conducting ring 220 by way of the configurable output via 230b.

The configurable circuit 104 is further configured to receive a second input signal from another adjacent semiconductor device 102 or another adjacent configurable circuit 104 located to the East thereof and routing a second output signal to yet another adjacent semiconductor device 102 or configurable circuit 104 located to the South thereof, without passing through the semiconductor element 200. More particularly, the East port 206d is configured to receive the second input signal by connecting the East port 206d to the bypass conducting ring 224b by way of the configurable bypass via 232d. The South port 206c outputs the second output signal because the bypass conducting ring 224b is connected to the South port 206c by way of the configurable output via 232c.

A signal diagram 300 illustrates the path traversed by the first and second signals through the configurable circuit 104 in the mesh structure 106. The first signal travels from the West port 206a to the North port 206b by way of the semiconductor element 200, and hence from the West to the North direction of the mesh structure 106. The second signal travels from the East port 206d to the South port 206c bypassing the semiconductor element 200, and hence from the East to the South direction of the mesh structure 106.

Figure 4:
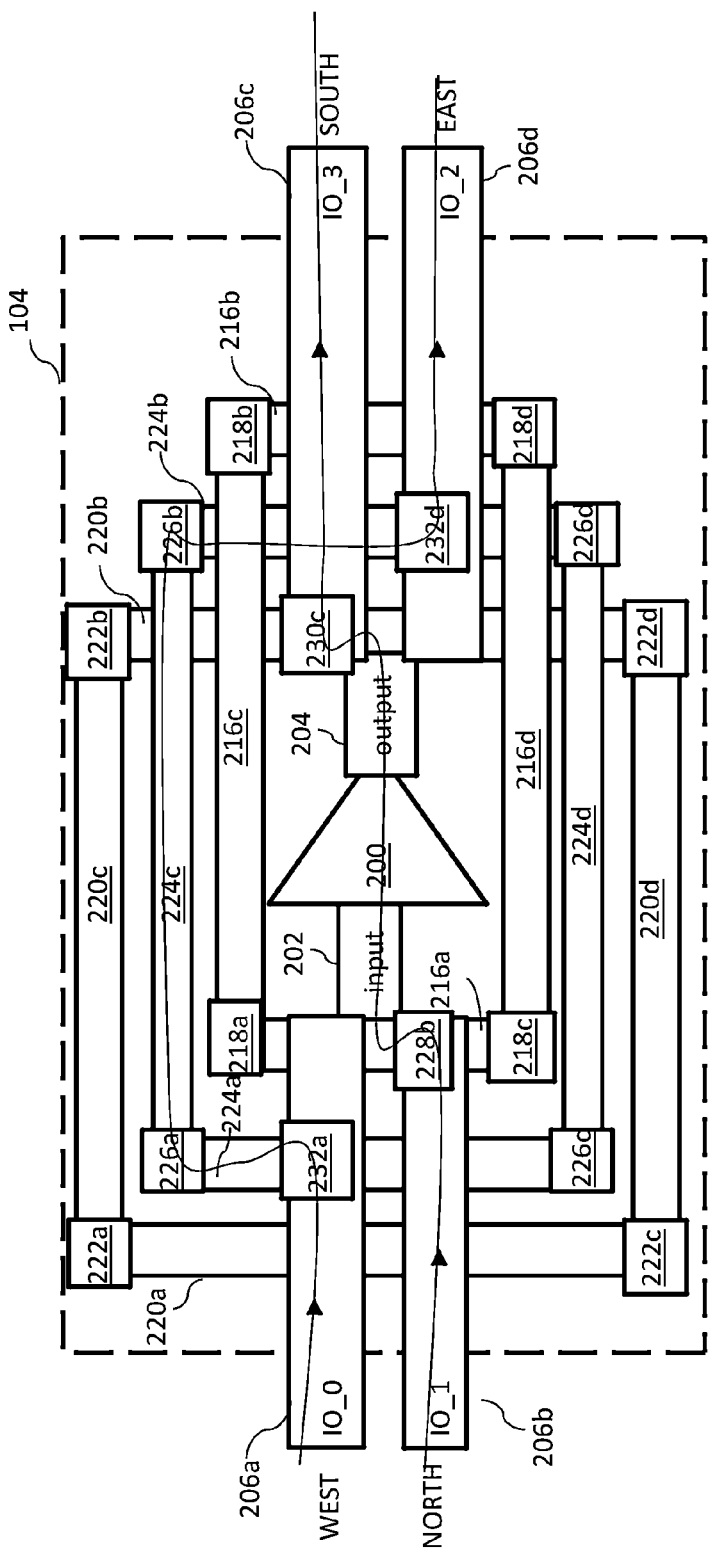
FIG. 4 is a schematic diagram of a configurable circuit configured for routing a first signal from North to South, and a second signal from West to East, in accordance with another embodiment of the present invention.
Figure 4:
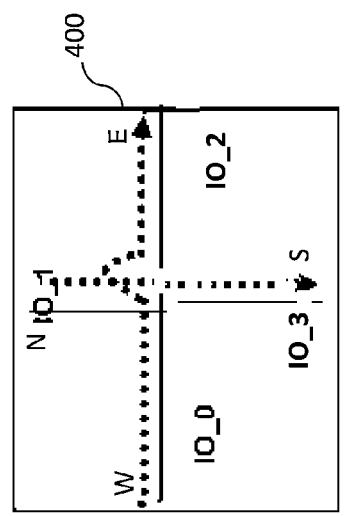

Referring now to FIG. 4, a schematic diagram of a configurable circuit 104 configured for routing a first signal from the North port 206b to the South port 206c, and routing a second signal from the West port 206a to the East port 206d, in accordance with an embodiment of the present invention, is shown.

The configurable circuit 104 receives a first input signal from an adjacent semiconductor device 102 or an adjacent configurable circuit 104 adjacently formed to the North thereof and provides a first output signal to another adjacent semiconductor device 102 or another adjacent configurable circuit 104 to the South thereof by way of the semiconductor element 200. The North port 206b receives the first input signal and passes the input signal to the semiconductor element 200 by way of the input conducting ring 216a and the configurable input via 228b. The semiconductor element 200 receives the first input signal and generates the first output signal. The South port 206c outputs the first output signal because the South port 206c is connected to the output conducting ring 220b by way of the configurable output via 230c.

The configurable circuit 104 is also configured for receiving a second input signal from another adjacent semiconductor device 102 or another adjacent configurable circuit 104 located to the West thereof and routing a second output signal to yet another semiconductor device 102 or a configurable circuit 104 located adjacent thereto to the East thereof, without passing through the semiconductor element 200, i.e., by bypassing the semiconductor element 200. The West port 206a receives the second input signal and provides it to the East port 206d by way of the bypass conducting ring 224 and the vias 232a, 226a, 226b, and 232d.

A signal diagram 400 illustrates the path traversed by the first and second signals through the configurable circuit 104 in the mesh structure 106. The first signal travels from the North port 206b to the South port 206c by way of the semiconductor element 200, and hence from the North to the South direction of the mesh structure 106. On the other hand, the second signal travels from the West port 206a to the East port 206d without passing the semiconductor element 200, and hence from the West to the East direction of the mesh structure 106.

It will be apparent to those skilled in the art that based on the input, output, and bypass configurable vias, a signal from one direction can be routed to any other direction through the semiconductor element 200 or by bypassing the semiconductor element. Only the configurable input, output and bypass vias 228, 230, and 232 need to be configured for a signal traveling in a first direction to change to another direction and only requires use of two metal layers. The routing of the signal using only two metal layers reduces the overall routing time of signals among the semiconductor devices 102.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit (IC) layout, comprising:
  a plurality of semiconductor devices including a source device and a destination device; and
  a plurality of configurable circuits connected between the source and destination devices in a mesh structure for routing a signal from the source device to the destination device, wherein each configurable circuit includes:
    a semiconductor element formed in a first semiconductor layer and having an input terminal for receiving the signal and an output terminal for outputting an output signal;
    first, second, third, and fourth bidirectional I/O ports formed in a second semiconductor layer, wherein the first, second, third, and fourth bidirectional I/O ports represent first, second, third, and fourth directions of the mesh structure, respectively;
    an input conducting ring including:
      first and second input conducting paths that are substantially parallel and formed in the first semiconductor layer;
      third and fourth input conducting paths that are substantially parallel and formed in the second semiconductor layer, wherein the third and fourth input conducting paths are orthogonal to the first and second input conducting paths; and
      first, second, third and fourth fixed input vias extending from the first semiconductor layer to the second semiconductor layer and connecting the first, second, third, and fourth input conducting paths;
    an output conducting ring including:
      first and second output conducting paths that are substantially parallel and formed in the first semiconductor layer;
      third and fourth output conducting paths that are substantially parallel and formed in the second semiconductor layer, wherein the third and fourth output conducting paths are orthogonal to the first and second output conducting paths; and
      first, second, third and fourth fixed output vias extending from the first semiconductor layer to the second semiconductor layer and connecting the first, second, third, and fourth output conducting paths;
    first and second configurable input vias extending from the first semiconductor layer to the second semiconductor layer and selectively connecting the first and second bidirectional I/O ports with the first input conducting path, respectively;
    third and fourth configurable input vias extending from the first semiconductor layer to the second semiconductor layer and selectively connecting the third and fourth bidirectional I/O ports with the second input conducting path, respectively;
    first and second configurable output vias extending from the first semiconductor layer to the second semiconductor layer and selectively connecting the first and second bidirectional I/O ports with the first output conducting path, respectively; and
    third and fourth configurable output vias extending from the first semiconductor layer to the second semiconductor layer and selectively connecting the third and fourth bidirectional I/O ports and the second output conducting path, respectively,
    wherein the first, second, third, and fourth configurable input vias are configured such that the signal is received from the source device at the input terminal from one of the first, second, third, and fourth directions by way of one of the first, second, third, and fourth bidirectional I/O ports, and the first, second, third, and fourth configurable output vias are configured such that the output signal is routed to the destination device from the output terminal in one of the first, second, third, and fourth directions by way of one of the first, second, third, and fourth bidirectional I/O ports.

2. The IC layout of claim 1, wherein each configurable circuit further includes a bypass conducting ring, wherein the bypass conducting ring includes:
  first and second bypass conducting paths that are substantially parallel and formed in the first semiconductor layer;
  third and fourth bypass conducting paths that are substantially parallel and formed in the second semiconductor layer, wherein the third and fourth bypass conducting paths are orthogonal to the first and second bypass conducting paths;
  first, second, third and fourth fixed bypass vias extending from the first semiconductor layer to the second semiconductor layer and connecting the first, second, third, and fourth bypass conducting paths;
  first and second configurable bypass vias extending from the first semiconductor layer to the second semiconductor layer and selectively connecting the first and second bidirectional I/O ports with the first bypass conducting path respectively; and
  third and fourth configurable bypass vias extending from the first semiconductor layer to the second semiconductor layer and selectively connecting the third and fourth bidirectional I/O ports with the second bypass conducting path, respectively;
  wherein the first, second, third, and fourth configurable bypass vias are configured such that a second signal received from a second source device from one of the first, second, third, and fourth directions by way of one of the first, second, third, and fourth bidirectional I/O ports is routed to a second destination device in one of the first, second, third, and fourth directions by way of one of the first, second, third, and fourth bidirectional I/O ports, and wherein the second signal bypasses the semiconductor element.

3. The IC layout of claim 2, wherein the first and second semiconductor layers comprise first and second metal layers.

4. The IC layout of claim 1, wherein the configurable circuit is a part of a cell library of an electronic design automation (EDA) tool.

5. The IC layout of claim 1, wherein the semiconductor element is at least one of a buffer, a repeater, a multiplexer and an inverter.

6. The IC layout of claim 1, wherein the source device is a source cell and the destination device is a spare cell of the IC layout.

7. The IC layout of claim 6, wherein the source cell and the spare cell are located in different semiconductor platforms of the IC layout.

8. An integrated circuit (IC) layout, comprising:
   a plurality of semiconductor devices including a source device and a destination device; and
   a plurality of configurable circuits connected between the source and destination devices in a mesh structure for routing a signal from the source device to the destination device, wherein each configurable circuit includes:
     a semiconductor element formed in a first semiconductor layer and having an input terminal for receiving the signal and an output terminal for outputting an output signal;
     first, second, third and fourth bidirectional input/output (I/O) ports formed in a second semiconductor layer, wherein the first, second, third, and fourth bidirectional I/O ports represent first, second, third, and fourth directions in the mesh structure, respectively;
     an input conducting ring including:
       first and second input conducting paths that are substantially parallel and formed in the first semiconductor layer;
       third and fourth input conducting paths that are substantially parallel and formed in the second semiconductor layer, wherein the third and fourth input conducting paths are orthogonal to the first and second input conducting paths; and
       first, second, third and fourth fixed input vias extending from the first semiconductor layer to the second semiconductor layer and connecting the first, second, third, and fourth input conducting paths;
     an output conducting ring including:
       first and second output conducting paths that are substantially parallel and formed in the first semiconductor layer;
       third and fourth output conducting paths that are substantially parallel and formed in the second semiconductor layer, wherein the third and fourth output conducting paths are orthogonal to the first and second output conducting paths; and
       first, second, third and fourth fixed output vias extending from the first semiconductor layer to the second semiconductor layer and connecting the first, second, third, and fourth output conducting paths;
     a bypass conducting ring including:
       first and second bypass conducting paths that are substantially parallel and formed in the first semiconductor layer;
       third and fourth bypass conducting paths that are substantially parallel and formed in the second semiconductor layer, wherein the third and fourth bypass conducting paths are orthogonal to the first and second bypass conducting paths;
       first, second, third and fourth fixed bypass vias extending from the first semiconductor layer to the second semiconductor layer and connecting the first, second, third, and fourth bypass conducting paths;
     first and second configurable input vias extending from the first semiconductor layer to the second semiconductor layer and selectively connecting the first and second bidirectional I/O ports with the first input conducting path, respectively;
     third and fourth configurable input vias extending from the first semiconductor layer to the second semiconductor layer and selectively connecting the third and fourth bidirectional I/O ports with the second input conducting path, respectively;
     first and second configurable output vias extending from the first semiconductor layer to the second semiconductor layer and selectively connecting the first and second bidirectional I/O ports with the first output conducting path, respectively;
     third and fourth configurable output vias extending from the first semiconductor layer to the second semiconductor layer and selectively connecting the third and fourth bidirectional I/O ports with the second output conducting path, respectively;
     first and second configurable bypass vias extending from the first semiconductor layer to the second semiconductor layer and selectively connecting the first and second bidirectional I/O ports with the first bypass conducting path respectively; and
     third and fourth configurable bypass vias extending from the first semiconductor layer to the second semiconductor layer and selectively connecting the third and fourth bidirectional I/O ports with the second bypass conducting path, respectively,
   wherein the first, second, third, and fourth configurable input vias are configured such that the signal is received from the source device at the input terminal from one of the first, second, third, and fourth directions by way of one of the first, second, third, and fourth bidirectional I/O ports, and the first, second, third, and fourth configurable output vias are configured such that the output signal is routed to the destination device from the output terminal in one of the first, second, third, and fourth directions by way of one of the first, second, third, and fourth bidirectional I/O ports, and
   wherein the first, second, third, and fourth configurable bypass vias are configured such that a second signal received from a second source device from one of the first, second, third, and fourth directions by way of one of the first, second, third, and fourth bidirectional I/O ports and routed to a second destination device in one of the first, second, third, and fourth directions by way of one of the first, second, third, and fourth bidirectional I/O ports, wherein the second signal bypasses the semiconductor element.

9. The IC layout of claim 8, wherein the first and second semiconductor layers comprise first and second metal layers.

10. The IC layout of claim 8, wherein the semiconductor element is at least one of a buffer, a repeater, multiplexer, and an inverter.

11. The IC layout of claim 8, wherein the source device is a source cell and the destination device is a spare cell.

12. The IC layout of claim 11, wherein the source cell and the spare cell are located in different semiconductor platforms of the IC layout.

13. The IC layout of claim 8, wherein the configurable circuit is a part of a cell library of an electronic design automation (EDA) tool.

14. A configurable circuit for routing a first input signal traveling in a first direction in a second direction, and routing a second input signal traveling in a third direction in a fourth direction, the configurable circuit comprising:
- a semiconductor element formed in a first semiconductor layer and having an input terminal for receiving the first input signal and an output terminal for outputting a first output signal;
- first, second, third and fourth bidirectional input/output (I/O) ports formed in a second semiconductor layer, wherein the first, second, third, and fourth bidirectional I/O ports are configured in respective North, South, East and West directions;
- an input conducting ring including:
  - first and second input conducting paths that are substantially parallel and formed in the first semiconductor layer;
  - third and fourth input conducting paths that are substantially parallel and formed in the second semiconductor layer, wherein the third and fourth input conducting paths are orthogonal to the first and second input conducting paths; and
  - first, second, third and fourth fixed input vias extending from the first semiconductor layer to the second semiconductor layer and connecting the first, second, third, and fourth input conducting paths;
- an output conducting ring including:
  - first and second output conducting paths that are substantially parallel and formed in the first semiconductor layer;
  - third and fourth output conducting paths that are substantially parallel and formed in the second semiconductor layer, wherein the third and fourth output conducting paths are orthogonal to the first and second output conducting paths; and
  - first, second, third and fourth fixed output vias extending from the first semiconductor layer to the second semiconductor layer and connecting the first, second, third, and fourth output conducting paths;
- first and second configurable input vias extending from the first semiconductor layer to the second semiconductor layer and selectively connecting the first and second bidirectional I/O ports with the first input conducting path, respectively;
- third and fourth configurable input vias extending from the first semiconductor layer to the second semiconductor layer and selectively connecting the third and fourth bidirectional I/O ports with the second input conducting path, respectively;
- first and second configurable output vias extending from the first semiconductor layer to the second semiconductor layer and selectively connecting the first and second bidirectional I/O ports with the first output conducting path, respectively; and
- third and fourth configurable output vias extending from the first semiconductor layer to the second semiconductor layer and selectively connecting the third and fourth bidirectional I/O ports with the second output conducting path, respectively,
- wherein the first input signal is input to the one of the first through fourth I/O ports having a direction that coincides with the first direction and the first, second, third, and fourth configurable input vias are configured such that the said one of the first through fourth I/O ports is connected to the input terminal of the semiconductor element, and
- wherein the first, second, third and fourth configurable output vias are configured such that the output terminal of the semiconductor element is connected to the one of the first through fourth I/O ports having a direction that coincides with the second direction.

15. The configurable circuit of claim 14, further comprising:
- a bypass conducting ring, the bypass conducting ring including:
  - first and second bypass conducting paths that are substantially parallel and formed in the first semiconductor layer;
  - third and fourth bypass conducting paths that are substantially parallel and formed in the second semiconductor layer, wherein the third and fourth bypass conducting paths are orthogonal to the first and second bypass conducting paths;
  - first, second, third and fourth fixed bypass vias extending from the first semiconductor layer to the second semiconductor layer and connecting the first, second, third, and fourth bypass conducting paths;
  - first and second configurable bypass vias extending from the first semiconductor layer to the second semiconductor layer and selectively connecting the first and second bidirectional I/O ports with the first bypass conducting path respectively; and
  - third and fourth configurable bypass vias extending from the first semiconductor layer to the second semiconductor layer and selectively connecting the third and fourth bidirectional I/O ports with the second bypass conducting path, respectively;
- wherein the first, second, third, and fourth configurable bypass vias are configured such that the second input signal is received from the one of the first, second, third, and fourth I/O ports having a direction that coincides with the third direction and is routed in the fourth by way of the one of the first, second, third, and fourth bidirectional I/O ports having a direction that coincides with the fourth direction, and wherein by being routed by way of the bypass conducting path the second input signal bypasses the semiconductor element.

16. The configurable circuit of claim 14, wherein the semiconductor element is at least one of a buffer, a repeater, a multiplexer, and an inverter.

17. The configurable circuit of claim 14, wherein the first and second semiconductor layers comprise first and second metal layers.

* * * * *